(12) United States Patent
Brawley et al.

(10) Patent No.: US 9,142,448 B2
(45) Date of Patent: Sep. 22, 2015

(54) METHOD OF PRODUCING A SILICON-ON-INSULATOR ARTICLE

(71) Applicant: The Silanna Group Pty Ltd, Eight Mile Plains, Queensland (AU)

(72) Inventors: Andrew John Brawley, Cecil Hillls (AU); Petar Branko Atanackovic, Henley Beach (AU); Andrew John Black, Melbourne (AU); Yong Cheow Gary Lim, Melbourne (AU)

(73) Assignee: THE SILANNA GROUP PTY LTD, Eight Mile Plains, Queensland (AU)

( * ) Notice: Subject to any disclaimer, the term of this patent is extended or adjusted under 35 U.S.C. 154(b) by 0 days.

(21) Appl. No.: 14/356,393

(22) PCT Filed: Nov. 2, 2012

(86) PCT No.: PCT/AU2012/001348
§ 371 (c)(1),
(2) Date: May 5, 2014

(87) PCT Pub. No.: WO2013/063652
PCT Pub. Date: May 10, 2013

(65) Prior Publication Data
US 2014/0312424 A1    Oct. 23, 2014

Related U.S. Application Data

(60) Provisional application No. 61/556,121, filed on Nov. 4, 2011.

(51) Int. Cl.
*H01L 21/762*    (2006.01)
*H01L 27/12*    (2006.01)
(Continued)

(52) U.S. Cl.
CPC ...... *H01L 21/76251* (2013.01); *H01L 21/2007* (2013.01); *H01L 21/76254* (2013.01);
(Continued)

(58) Field of Classification Search
None
See application file for complete search history.

(56) References Cited

U.S. PATENT DOCUMENTS 5,374,564 A   12/1994 Bruel
5,855,693 A * 1/1999 Murari et al. ................. 148/33.3
(Continued)

FOREIGN PATENT DOCUMENTS

WO    2013063652 A1    5/2013

OTHER PUBLICATIONS

Chu, P.K. "Novel Silicon-on-insulator Structures for Reduced Self-heating Effects." IEEE Circuits and Systems Magazine 5.4 (2005): 18-29.*
(Continued)

*Primary Examiner* — Joseph Schoenholtz
(74) *Attorney, Agent, or Firm* — Nixon Peabody LLP; Joseph Bach, Esq.

(57) ABSTRACT

A method of producing a silicon-on-insulator article, the method including: forming a first aluminum nitride layer thermally coupled to a first silicon substrate; forming a second aluminum nitride layer thermally coupled to a second substrate, the second substrate including at least a surface layer of silicon; bonding the first and second aluminum nitride layers of the first and second substrates together so that the first and second aluminum nitride layers are disposed between the first and second substrates; and removing most of the second substrate to leave a layer of silicon that is electrically insulated from but thermally coupled to the first silicon substrate by the first and second aluminum nitride layers.

27 Claims, 7 Drawing Sheets

(51) Int. Cl.
H01L 29/772 (2006.01)
H01L 21/20 (2006.01)
H01L 21/84 (2006.01)
H01L 29/786 (2006.01)

(52) U.S. Cl.
CPC .......... *H01L21/76262* (2013.01); *H01L 21/84* (2013.01); *H01L 27/1203* (2013.01); *H01L 29/78603* (2013.01)

(56) References Cited

U.S. PATENT DOCUMENTS

| | | | |
|---|---|---|---|
| 7,977,747 B2 * | 7/2011 | Allibert et al. | 257/347 |
| 2010/0148322 A1 | 6/2010 | Allibert et al. | |
| 2013/0294038 A1 * | 11/2013 | Landru et al. | 361/748 |

OTHER PUBLICATIONS

Zhu, Ming, Weili Liu, Zhitong Song, Ricky K.y. Fu, Paul K. Chu, and Chenglu Lin. "Formation of Silicon-on-aluminum Nitride Using Ion-cut and Theoretical Investigation of Self-heating Effects." Materials Letters 59.4 (2005): 510-13.*

Why Higher Resistivity Wafers? downloaded from URL<http://sunedisonsemi.com/assets/file/products/advanced-materials/hi-low%20res_rev10102003.pdf> on Jan. 23, 2015.*

Vispute, R. D., J. Narayan, Hong Wu, and K. Jagannadham. "Epitaxial Growth of AlN Thin Films on Silicon (111) Substrates by Pulsed Laser Deposition." Journal of Applied Physics 77.9 (1995): 4724.*

Hong, Sung-Ui, Mun-Cheol Paek, Gee-Pyeong Han, Young-Joon Sohn, Tae-Youb Kim, Kyoung-Ik Cho, Kyu-Hwan Shim, and Soon-Gil Yoon. "Characterization of Aluminum Nitride Thin Films on Silicon Substrates Grown by Plasma Assisted Molecular Beam Epitaxy." Japanese Journal of Applied Physics 41.Part 1, No. 9 (2002): 5507-512.*

Jin, Hao, Bin Feng, Shurong Dong, Changjian Zhou, Jian Zhou, Yi Yang, Tianling Ren, Jikui Luo, and Demiao Wang. "Influence of Substrate Temperature on Structural Properties and Deposition Rate of AlN Thin Film Deposited by Reactive Magnetron Sputtering." Journal of Electronic Materials 41.7 (2012): 1948-954.*

Meng, Xiangqin, Chengtao Yang, and Jiancang Yang. "Structure and Electrical Properties of AlN Films Prepared on PZT Films by the DC Reactive Magnetron Sputtering." Electronic Materials Letters 10.1 (2014): 127-30.*

Jyoti Prakash Kar and Gouranga Bose (2011). Aluminum Nitride (AlN) Film Based Acoustic Devices: Material Synthesis and Device Fabrication, Acoustic Waves—From Microdevices to Helioseismology, Prof. Marco G. Beghi (Ed.), ISBN: 978-953-307-572-3, In Tech.*

Lin, C.-M., Lien, W.-C, Felmetsger, V., Senesky, D.G., Hopcroft, M.A. and A.P. Pisano, "Growth of Highly C-Axis Oriented AlN Films on 3C-SiC/Si Substrate," In Proceedings of the Solid-State Sensors, Actuators and Microsystems Workshop, Hilton Head, South Carolina, 2010.*

Chu, P.K., "Novel Silicon-on-Insulator Structures for Reduced Self-Heating Effects," IEEE Circuits and Systems Magazine, 2005, vol. 5, Issue 4, pp. 16-27.

Dargis, R., et al., "Epitaxial Growth and Properties of Silicon on Crystalline Rare-Earth-Metal Oxide for SOI-Applications," Materials Science, 2009, vol. 15, No. 1, pp. 11-15.

Men, C., et al., "Fabrication of SOI Structure With AlN Film as Buried Insulator by Ion-Cut Process," Elsevier, Applied Surface Science, 2002, vol. 199, pp. 287-292.

Tan, L., et al., "Fabrication of Novel Double-Hetero-Epitaxial SOI Structure Si/y-Al2O3/Si," Journal of Crystal Growth, 2003, vol. 247, pp. 255-260.

Zhu, M., et al., "Formation of Silicon-on-Aluminum Nitride Using Ion-cut and Theoretical Investigation of Self-heating Effects," Elsevier, Materials Letters, 2005, vol. 59, Issue 4, pp. 510-513.

International Search Report and Written Opinion in PCT Application No. PCT/AU2012/001348, mailed Jan. 23, 2013.

International Preliminary Report on Patentability in PCT Application No. PCT/AU2012/001348, mailed Feb. 27, 2014.

* cited by examiner ific Application No. 61/556,
METHOD OF PRODUCING A SILICON-ON-INSULATOR ARTICLE

RELATED APPLICATIONS

This application is a National Phase of International Application No. PCT/AU2012/001348, filed on Nov. 2, 2012, and which claims priority of U.S. Patent Application No. 61/556,121, filed on Nov. 4, 2011, and the disclosures of which are hereby incorporated by reference herein in their entirety.

TECHNICAL FIELD

The present invention relates to semiconductor manufacturing, and in particular to a silicon-on-insulator (SOI) article or product which can be used to manufacture semiconductor devices, and a method of producing an SOI article or product.

BACKGROUND

The term "silicon-on-insulator" or "SOI" generally refers to a composite semiconductor article or product consisting of a thin layer of silicon attached to and supported by an insulating layer or substrate, and also to technologies based on such products. In view of their role as starting materials for subsequent processing, such articles are often referred to in the art as "substrates" and are typically provided in standard wafer form so that they can be used with standard semiconductor manufacturing equipment and processes.

SOI substrates can be manufactured by a variety of different methods, including the direct deposition or epitaxial growth of a thin layer of silicon on a compatible electrically insulating (e.g., sapphire) substrate, the in situ formation of a buried layer of $SiO_2$ under a single-crystal silicon layer by implanting oxygen into a bulk silicon wafer in accordance with the SIMOX (separation by implantation of oxygen) method, and methods based on wafer bonding, including BE-SOI (bond-and-etch-back SOI), and layer transfer methods such as the Smart-Cut™ method described in U.S. Pat. No. 5,374,564. Although SOI wafers are more expensive than monolithic or bulk silicon wafers, they provide a number of technical advantages, particularly when high speed electronic devices are formed in the thin silicon layer, including reduced junction capacitance, low standby power, radiation tolerance, and freedom from latchup.

The standard form of SOI substrate is a 'sandwich' structure wherein a buried silicon dioxide ($SiO_2$) layer provides the desired electrical isolation between the thin silicon layer and a thick supporting silicon base or substrate. However, this buried dielectric layer is also a barrier to heat flow from the devices fabricated in the silicon layer, due to the relatively poor thermal conductivity of $SiO_2$. Consequently, the temperature of the channel of a MOSFET device formed in the thin silicon layer inevitably increases during operation to temperatures that are substantially higher than the corresponding temperatures of an equivalent device formed in a bulk silicon wafer, thereby degrading the performance and possibly the lifetime of the device.

To address this issue, a number of researchers have fabricated SOI substrates in which a buried layer of aluminium nitride (AlN), rather than the conventional $SiO_2$, is used as the insulating material. This arrangement greatly reduces the often severe self-heating problem of conventional SOL since the thermal conductivity of AlN is ~100 times that of $SiO_2$, (136 W/mK vs. 1.4 W/mK) and is roughly equal to that of silicon itself 145 W/mK. In addition, AlN has excellent thermal stability, high electrical resistance and a coefficient of thermal expansion close to that of silicon.

For example, as described in M. Zhu et. al., *Formation of silicon-ion-aluminum nitride using ion-cut and theoretical investigation of self-heating effects*, Materials Letters 59 (2005) 510-513, and in C. Men et. al., *Fabrication of SOI structure with AlN film as buried insulator by Ion-Cut process*, Applied Surface Science 199 (2002) 287-292, an AlN layer can be formed on a standard (100) silicon wafer by metal plasma immersion ion implantation deposition (Me-PIIID), or by ion beam enhanced deposition (IBED) with the electron beam evaporation of Al and simultaneous bombardment of nitrogen ion beam. Then the deposited film can be directly bonded to a standard (100) silicon wafer that has previously been implanted with high energy hydrogen ions to form a buried layer. The bonded wafers can then be heated to strengthen the bond between the wafers and to cause the surface layer of the implanted wafer to split off using an ion-cut or Smart-Cut™ method. The result is a silicon-on-aluminum nitride or 'SOAN' substrate.

Despite the promise of SOAN substrates, they have not progressed beyond the research phase and are not commercially available. The inventors of the present invention believe this is likely to be caused by poor bonding between the silicon and aluminum nitride surfaces, due not only to common factors such as surface roughness and wafer flatness, but also to inherent poor bonding strength between these two materials. The rather poor quality of the deposited AlN layer may also play a role.

It is desired to provide a silicon-on-insulator article and a method of forming a silicon-on-insulator article that alleviate one or more difficulties of the prior art, or that at least provide a useful alternative.

SUMMARY

Some embodiments of the present invention relate to a method of producing a silicon-on-insulator article, the method including:

forming a first aluminium nitride layer thermally coupled to a first silicon substrate;

forming a second aluminium nitride layer thermally coupled to a second substrate, the second substrate including at least a surface layer of silicon;

bonding the first and second aluminium nitride layers of the first and second substrates together so that the first and second aluminium nitride layers are disposed between the first and second substrates; and removing most of the second substrate to leave a layer of silicon that is electrically insulated from but thermally coupled to the first silicon substrate by the first and second aluminium nitride layers;

wherein the combined thickness of the bonded aluminium nitride layers is selected to be at least 200 nm to provide substantial electrical isolation between the first silicon substrate and CMOS devices formed in the layer of silicon, while the thermal conductivities of the first and second aluminium nitride layers nevertheless enable substantial conduction of heat through the bonded aluminium nitride layers to mitigate self-heating of the CMOS devices formed in the layer of silicon.

In some embodiments the combined thickness of the bonded aluminium nitride layers is between about 200 nm and 2 µm.

In some embodiments the combined thickness of the bonded aluminium nitride layers is about 2 µm.

In some embodiments the combined thickness of the bonded aluminium nitride layers is at least 2 μm.

In some embodiments, the first silicon substrate has an electrical resistivity of at least 100 Ohm-cm. In some embodiments, the first silicon substrate has a (111) crystal orientation. In other embodiments, the first silicon substrate has a (100) crystal orientation.

In some embodiments, the first aluminium nitride layer is epitaxially grown on the first silicon substrate. In some embodiments, the second aluminium nitride layer is epitaxially grown on the second substrate. In some embodiments, the first and second aluminium nitride layers are simultaneously epitaxially grown on the first and second substrates.

In some embodiments, at least the first of the aluminium nitride layers has an (002) crystal orientation. In some embodiments, the layer of silicon has a (100) crystal orientation. In some embodiments, the layer of silicon has an electrical resistivity of at least 100 Ohm-cm. In some embodiments, the second substrate is a bulk silicon substrate.

In some embodiments, said removing includes splitting the bulk silicon substrate using an ion cut process.

In some embodiments, the second substrate is a silicon-on-insulator substrate.

In some embodiments, the method includes forming respective silicon nitride layers on the first substrate and the second substrate; wherein the first and second aluminium nitride layers are formed on the respective silicon nitride layers.

In some embodiments, the method includes forming respective first and second bonding layers on the first and second aluminium nitride layers; wherein said bonding includes bonding the first and second bonding layers of the first and second substrates together so that the first and second bonding layers are disposed between the first and second aluminium nitride layers.

In some embodiments, the first and second bonding layers are silicon layers.

Some embodiments of the present invention relate to a method of producing a silicon-on-insulator article, the method including:
  epitaxially growing an aluminium nitride layer on a single-crystal silicon substrate; and epitaxially growing a silicon layer on the aluminium nitride layer;
  wherein the silicon layer is electrically insulated from but thermally coupled to the silicon substrate by the aluminium nitride layer, the thickness of the epitaxial aluminium nitride layer being selected to be at least 200 nm to provide substantial electrical isolation between the single-crystal silicon substrate and CMOS devices formed in the silicon layer, while the thermal conductivity of the epitaxial aluminium nitride layer nevertheless enables substantial conduction of heat through the epitaxial aluminium nitride layer to the single-crystal silicon substrate to mitigate self-heating of the CMOS devices formed in the silicon layer.

Some embodiments of the present invention relate to a silicon-on-insulator article, including:
  a (100) silicon layer;
  a silicon substrate; and
  an (002) aluminium nitride layer disposed between the (100) silicon layer and the silicon substrate, such that the (100) silicon layer is electrically insulated from but thermally coupled to the silicon substrate by the aluminium nitride layer, the thickness of the (002) aluminium nitride layer being at least 200 nm to provide substantial electrical isolation between the silicon substrate and CMOS devices formed in the (100) silicon layer, while the thermal conductivity of the (002) aluminium nitride layer nevertheless enables substantial conduction of heat through the (002) aluminium nitride layer to the silicon substrate to mitigate self-heating of the CMOS devices formed in the (100) silicon layer.

In some embodiments, the silicon substrate has a (111) orientation. In some embodiments, the silicon substrate, the silicon layer and the aluminium nitride layer are mutually epitaxial.

Some embodiments of the present invention relate to a silicon-on-insulator article, including:
  a silicon layer;
  a silicon substrate; and
  aluminium nitride layers disposed between the silicon layer and the silicon substrate; and
  at least one bonding layer disposed between the aluminium nitride layers;
  wherein the silicon layer is electrically insulated from but thermally coupled to the silicon substrate by the aluminium nitride layers, the thickness of the aluminium nitride layers being at least 200 nm to provide substantial electrical isolation between the silicon substrate and CMOS devices formed in the silicon layer, while the thermal conductivities of the aluminium nitride layers nevertheless enable substantial conduction of heat through the aluminium nitride layers to the silicon substrate to mitigate self-heating of the CMOS devices formed in the silicon layer.

In some embodiments, the at least one bonding layer includes at least one silicon layer.

The resulting low cost substrate with high thermal conductivity enables the fabrication of high performance fully-depleted or partially depleted complementary metal oxide silicon (CMOS) circuits for high frequency and power applications while mitigating self-heating effects. This substrate with its piezoelectric AlN layer also enables the fabrication of high-Q surface acoustic wave (SAW) devices.

BRIEF DESCRIPTION OF THE DRAWINGS

Some embodiments of the present invention are hereinafter described, by way of example only, with reference to the accompanying drawings, wherein:

FIGS. 2 to 6 are cross-sectional side views illustrating the processing of two silicon substrates in accordance with the process of FIG. 1, wherein:

FIG. 2 shows two silicon substrates;

FIG. 3 shows the silicon substrates with respective layers of aluminium nitride (AlN) formed thereon;

FIGS. 4 and 5 illustrate the mutual bonding of the two substrates by their AlN layers to form a stack;

FIG. 6 shows the stack after the majority of one silicon substrate has been removed, leaving only a thin silicon layer and thereby providing an SOI article or product;

FIGS. 7 to 11 are schematic cross-sectional side views illustrating the described Example of the process of FIG. 1, wherein:

FIG. 7 illustrates the ion implantation of hydrogen through the AlN layer and into the silicon wafer of one of the wafers of FIG. 3 to form a buried layer of hydrogen;

FIGS. 8 and 9 illustrate the mutual bonding of the two substrates by their AlN layers to form a stack;

FIG. 10 illustrates the splitting of the implanted substrates along a layer of structural defects corresponding to the hydrogen layer to leave only a thin silicon layer; and FIG. 11 shows the final SOI article after polishing to remove the surface roughness resulting from the splitting.

DETAILED DESCRIPTION

Figure 1:
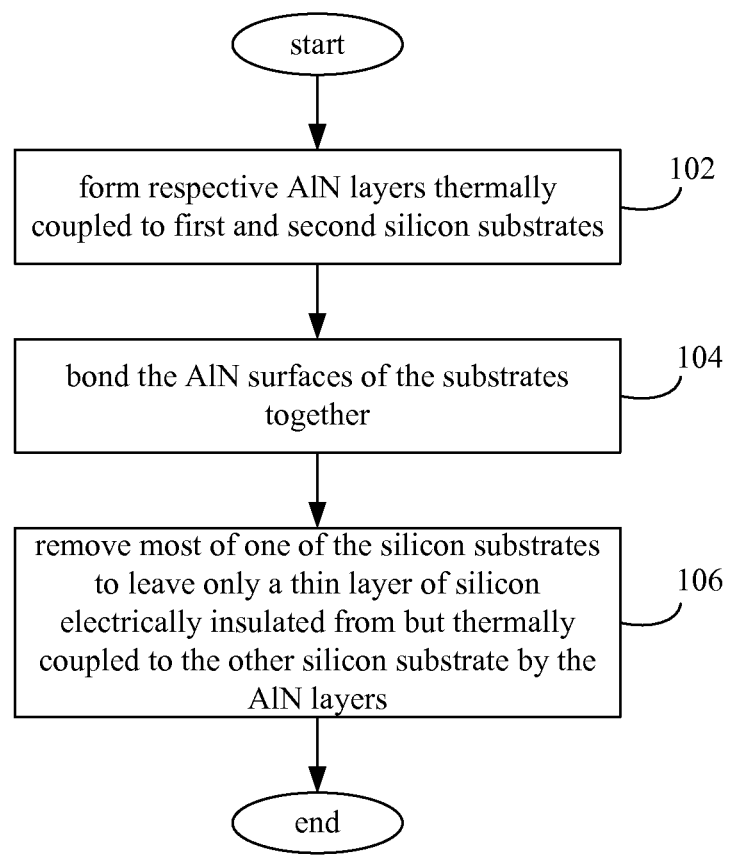
FIG. 1 is a flow diagram of a process for producing a silicon-on-insulator (SOI) article or product in accordance with some embodiments of the present invention.
Figure 2:
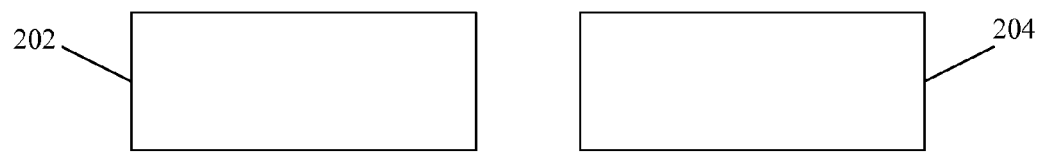

FIG. 1 is a flow diagram of a process for producing a silicon-on-insulator (SOI) article or product. The process begins with two substrates 202, 204, as shown in FIG. 2. The first substrate 202 is a silicon substrate and may be a silicon wafer. The first substrate 202 may have a relatively high electrical resistivity of at least 100 Ohm-cm.

The second substrate 204 can be any type of substrate that includes at least a surface layer of silicon. For example, the second substrate may be a silicon wafer or a silicon-on-insulator wafer. The silicon surface of the second substrate 204 may have a relatively high electrical resistivity of at least 100 Ohm-cm.

Figure 3:
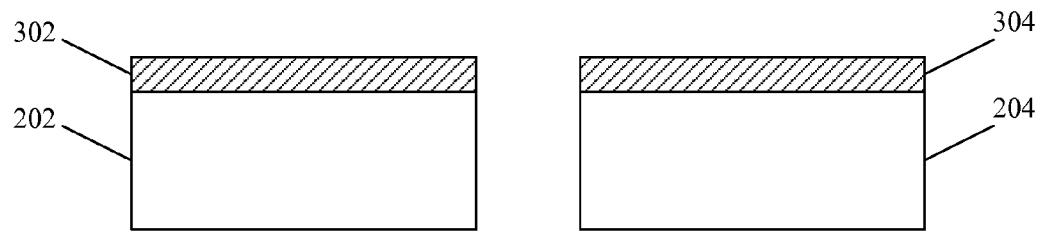

At step 102 of the process, a first aluminium nitride layer 302 is formed on or at least thermally coupled to the first substrate 202, and a second aluminium nitride layer 304 is formed on or at least thermally coupled to the second substrate 204, as shown in FIG. 3. In general, the thickness of each AlN layer 302, 304 is selected according to the application for which it will be used, but is typically in the range of about 100 nm to 1 µm.

The AlN layers 302, 304 can be formed by any of a variety of methods, including standard methods known to those skilled in the art, for example pulsed laser deposition, reactive sputtering, metal-organic chemical vapour deposition (MO-CVD), hydride vapour phase epitaxy (HYPE), molecular-beam epitaxy (MBE), metal plasma immersion ion implantation-deposition (Me-PIIID), or ion-beam enhanced deposition (IBED) with the electron beam evaporation of Al and simultaneous bombardment of nitrogen ion-beam. In some embodiments, the first and second aluminium nitride layers 302, 304 are formed in parallel (i.e., simultaneously) in the same apparatus, thereby improving the efficiency and reducing the cost of the process. In other embodiments, the first and second aluminium nitride layers 302, 304 may be formed independently.

In some embodiments, a relatively thin layer of at least one third material is formed on the silicon surfaces of the substrates 202, 204 prior to forming the aluminium nitride layers 302, 304 in order to enhance the adhesion between the silicon surfaces of the substrates 202, 204 and the aluminium nitride layers 302, 304. In some embodiments, the third material is a silicon nitride layer. In some embodiments, the silicon nitride layer has a thickness of about 5 nm. However, as will be apparent to those skilled in the art, other thicknesses and materials may be used in other embodiments not described herein, and in general one or more relatively thin layers of one or more other materials could be formed between either or both of the silicon substrates 202, 204 and the aluminium nitride layers 302, 304.

In some embodiments, the first aluminium nitride layer 302 is an epitaxial layer grown on the single-crystal silicon surface of the first substrate 202. In some embodiments, both of the aluminium nitride layers 302, 304 are epitaxial layers grown on the single-crystal silicon surfaces of the respective substrates 202, 204. This ensures strong bonding of the AlN layers 302, 304 to the silicon surfaces, and also that the RMS surface roughness of the AlN surfaces is <1 nm. In some embodiments, at least the first of the aluminium nitride layers 302 is a single crystal layer having an (002) crystal orientation, as this orientation of aluminium nitride has desirable properties for piezoelectric applications. In some embodiments, both of the aluminium nitride layers 302, 304 are formed with this crystal orientation. In some embodiments, the first silicon substrate 202 is selected to have a (111) crystal orientation, as (002) aluminium nitride grows most readily on this orientation of silicon, although as known to those skilled in the art, it can also be grown on (100) Si. In some embodiments, the silicon surface of the second substrate 204 has a (100) crystal orientation. This can be beneficial as most standard silicon processes (in particular, CMOS processes) are configured for (100) silicon.

Figure 4:
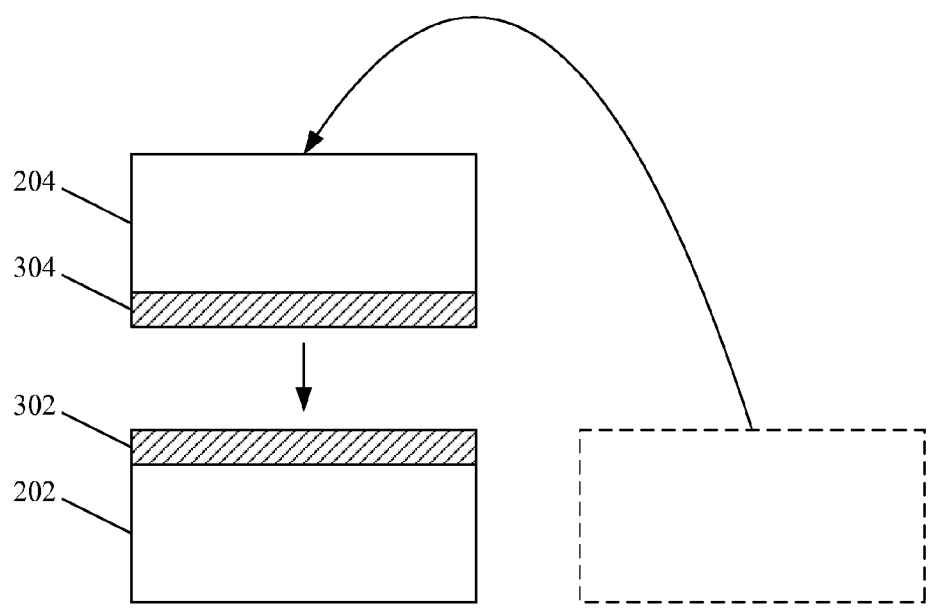
Figure 5:
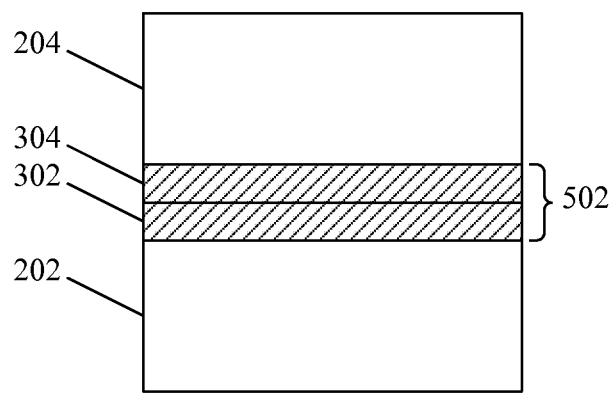
Figure 6:
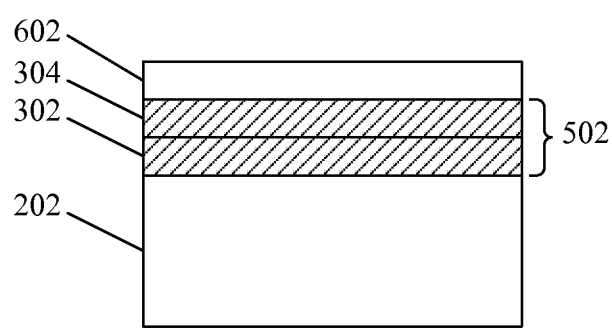

As illustrated in FIGS. 4 and 5, at step 104 the second substrate 204 is flipped over and the surfaces of the aluminium nitride layers 302, 304 are brought together to initiate bonding between the aluminium nitride layers 302, 304 and form a stack in which the aluminium nitride layers 302, 304 are disposed between the first and second substrates 202, 204. Because the bonding surfaces are both aluminium nitride surfaces with low surface roughness, fusion or 'direct' bonding can be used to form a strong bond between the aluminium nitride layers 302, 304. As known by those skilled in the art, fusion bonding is strengthened by subjecting the stack to a low temperature heat treatment. If the aluminium nitride layers 302, 304 are indistinguishable (e.g., if they are formed by the same process and have the same crystal orientation), then once bonded they can be considered to form a single aluminium nitride layer 502 (notwithstanding that the separate AlN layers are still represented in FIGS. 5 and 6). The face-to-face bonding of the two aluminium nitride layers 302, 304 also provides a greater thickness of aluminium nitride between the two silicon substrates 202, 204 than may otherwise be the case, and where the aluminium nitride layers 302, 304 are formed simultaneously, this is achieved without increasing the total deposition/growth time.

As will be appreciated by those skilled in the art, aluminium nitride oxidises rapidly when exposed to oxygen, and the formation of oxide layers on the aluminium nitride layers 302, 304 has the potential to decrease the strength of bonding between these two layers 302, 304. A number of precautions can be taken to suppress this oxidation, including performing the bonding step as soon as possible after the growth of the layers 302, 304 and maintaining the layers 302, 304 under vacuum the entire time, by capping the layers 302, 304, or by forming the AlN layers 302, 304 so that they have nitrogen-rich surfaces.

In an alternative embodiment, the aluminium nitride layers 302, 304 are 'capped' by forming respective first and second silicon layers on the aluminium nitride layers 302, 304. As in the embodiments described above, the second substrate 204 is flipped over, but in this embodiment the surfaces of the silicon layers are brought together to initiate mutual bonding therebetween, forming a stack in which the silicon layers are disposed between the aluminium nitride layers 302, 304 which, in turn, are disposed between the first and second substrates 202, 204. As known by those skilled in the art, fusion or 'direct' bonding between silicon surfaces is a standard and well characterised process that provides a strong bond between two silicon surfaces, and thus, in the present context, between the aluminium nitride layers 302, 304. The silicon 'bonding' layers can be very thin (e.g., about 50 nm) relative to the thickness of the aluminium nitride layers 302, 304, and thus have a minimal effect on the overall thermal conductance of the layer stack. Indeed, it will be apparent to those skilled in the art that the ability to use extremely thin films for the bonding layers allows one or more materials other than silicon to be used for this purpose in other embodiments, even materials having lower thermal conductivities, providing that they have good adhesion to the aluminium nitride layers 302, 304 and to each other (or itself when the same material is used) when one of the substrates is flipped and the two faces of the bonding layers are bonded together. For example, in one such embodiment, silicon nitride bonding layers are formed on the aluminium nitride layers 302, 304 and then bonded together as described above.

At step 106, most of the second substrate is removed to leave a relatively thin layer 602 of silicon. In some embodiments, this is achieved using a bond and etch-back process, as in a standard BE-SOI wafer process. In embodiments where the second substrate 204 is a silicon-on-insulator substrate or wafer, this can be achieved by etching and/or grinding away the second substrate 204 up to the interface between the insulator and the surface silicon layer. In some embodiments, the removal is achieved using a Smart-cut™ or ion-cut process known to those skilled in the art. In any case, the resulting surface of the silicon layer 602 can be polished if required.

Figure 12:
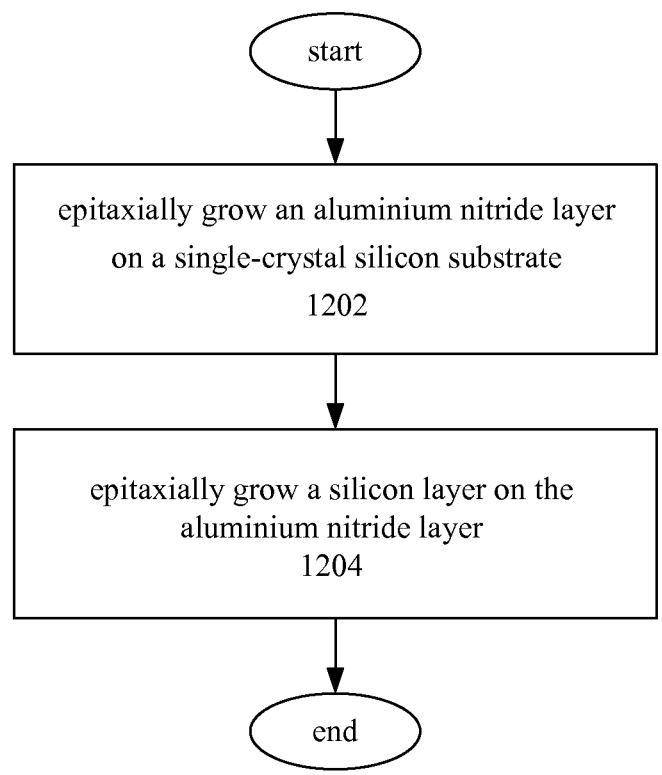
FIG. 12 is a flow diagram of an alternative process for producing a silicon-on-insulator (SOI) article or product in accordance with further embodiments of the present invention.

In an alternative process, as shown in the flow diagram of FIG. 12, the first silicon substrate 202 and an epitaxial (002) aluminium nitride layer 302 are formed at step 1202, as described above. However, rather than using wafer bonding technology, a new silicon layer is epitaxially grown on the (002) aluminium nitride layer 302 at step 1204, and the entire process can be performed in the one reactor or growth chamber. The silicon layer can be grown to have an (100) orientation or a (111) orientation.

The result of the above processes is a silicon-on-insulator (SOI) article or product in which a thin layer of silicon 602 is electrically insulated from a supporting silicon substrate 202 by a layer of aluminium nitride 502. Unlike SOI structures using other insulating materials, the high thermal conductivity of the aluminium nitride layer 502 provides an efficient path for heat conduction from the silicon layer 602 to the silicon substrate 202, thereby alleviating the thermal limitations on devices formed in or on the silicon layer 602.

In some embodiments, the base or substrate of silicon (Si) 202 is a high resistivity substrate having an electrical resistivity of at least 40 Ohm-cm and in some embodiments at least 100 Ohm-cm to improve the high frequency (e.g., GHz and above) performance of electronic devices (including RF devices) and high-Q passive devices formed in or from the silicon layer 602.

The described embodiments of the present invention therefore include a relatively low cost SOI substrate with high thermal conductivity, which enables the fabrication of high performance fully-depleted or partially depleted complementary metal oxide silicon (CMOS) circuits for high frequency and power applications to address self-heating effects.

The aluminium nitride layer 502 has excellent thermal stability, high electrical resistance, and a coefficient of thermal expansion close to that of silicon, thereby reducing the risk of delamination.

EXAMPLE 200 nm thick layers 702, 704 of AlN were simultaneously deposited onto the cleaned silicon surfaces of two silicon wafers 706, 708 by reactive sputtering (RS) at a temperature of about 300° C. The wafers 706, 708 were 600 µm thick, bulk single crystal wafers having a surface roughness of <1 nm and a high electrical resistivity of >100 Ohm-cm. Both wafers 706, 708 had a (100) crystal orientation. Both AlN layers 702, 704 were grown to have a nitrogen rich surface to reduce oxidation and thereby increase the bonding strength between the two AlN layers 702, 704.

Figure 7:
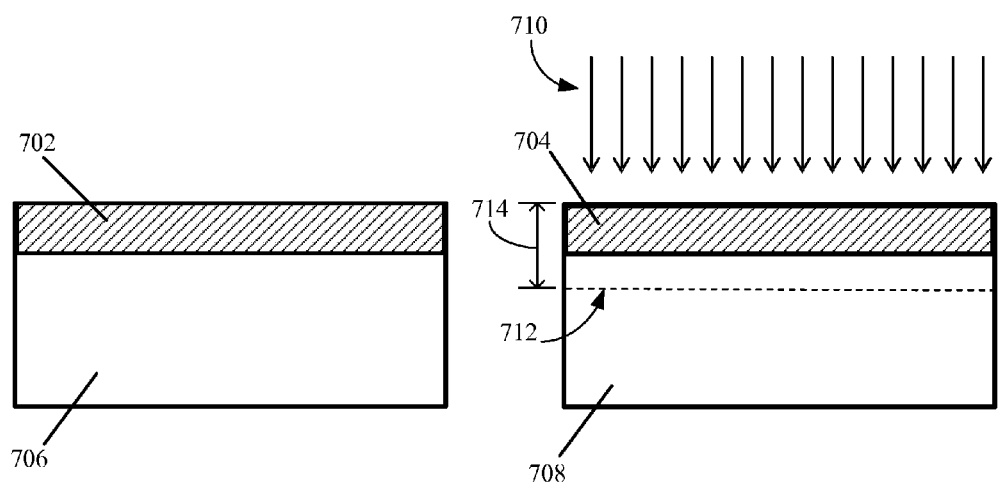

As shown in FIG. 7, one silicon wafer 708 (only) was then ion-implanted with hydrogen ions 710 through the AlN layer 704 to a fluence or areal density of $6 \times 10^{16}$ cm$^{-2}$ at an energy of 150 keV. This formed a buried layer 712 of hydrogen at a depth 714 of about 1.21±0.01 µm below the wafer surface; i.e., about 1.0 µm below the AlN:Si interface.

Figure 8:
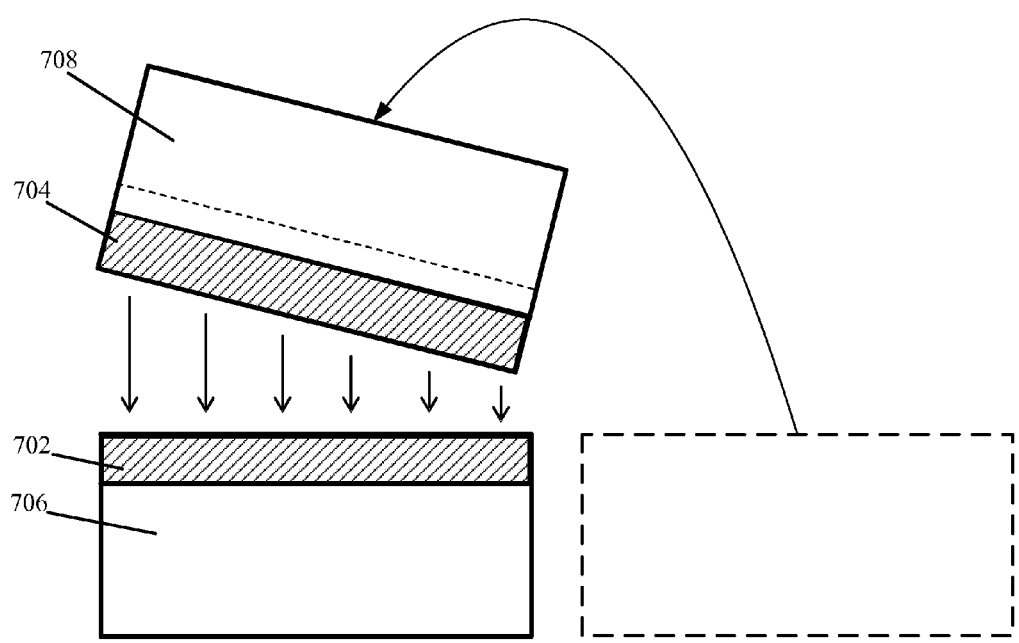

As shown in FIG. 8, the AlN layers 702, 704 were then bonded face-to-face at room temperature using a Karl Suss SB6 VAC wafer bonder. During bonding, a small pressure was initially applied to the centre and then a pressure of 1 atmosphere was applied to the entire wafer stack for about 1 minute.

Figure 9:
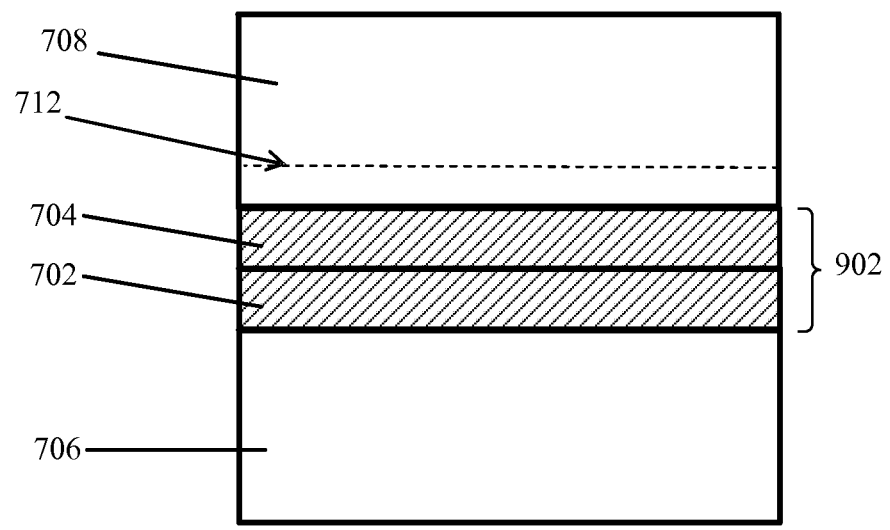

The resulting wafer stack is shown in FIG. 9. The strength of bonding was then increased by heating the stack for a short period at a low temperature (2 hours at 120° C.) and then raising the temperature for a longer period (about 300° C. for 10 hours) to improve the bonding strength. The two mutually bonded AlN layers 702, 704 could then be considered to constitute a single AlN layer 902.

Figure 10:
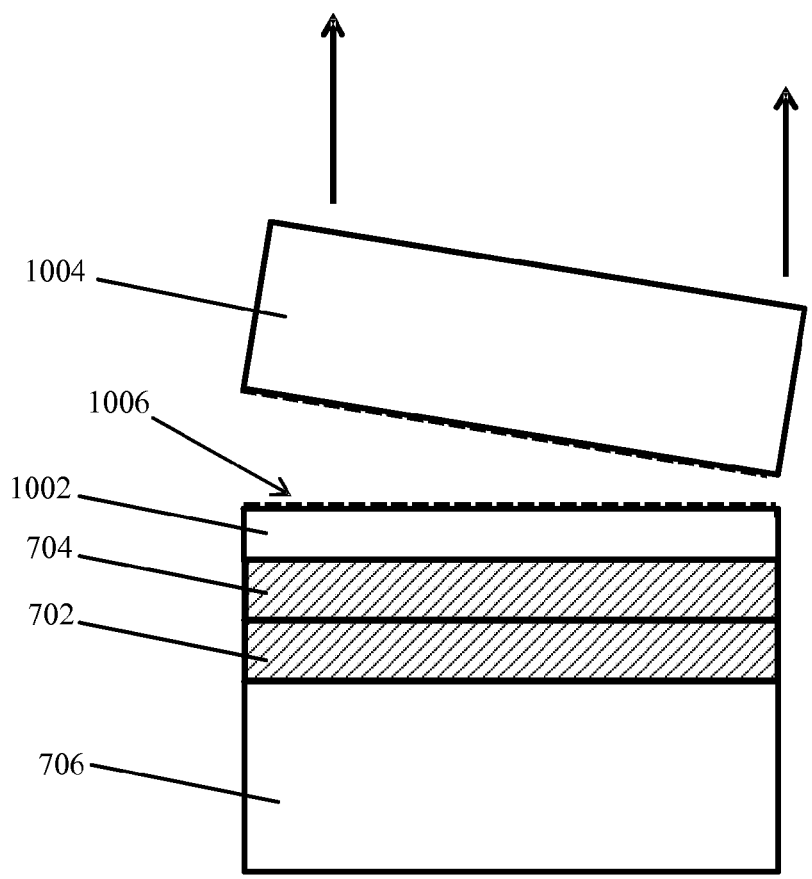

As shown in FIG. 10, the wafer stack was then heated to 450° C. for 15 minutes in nitrogen to cause the hydrogen-implanted Si wafer 906 to split along a buried layer of structural defects corresponding to the buried hydrogen layer 712, leaving only a relatively thin (≈1.0 µm) silicon layer 1002 attached to the AlN layers. The stack was then subjected to a further heat treatment performed in a nitrogen ambient at 1000° C. for 1 hour to further improve the bond strength and also to anneal implantation defects in the remaining silicon layer 1002.

The detached portion 1004 of the transfer wafer 906 was removed, and the remaining thin bonded silicon layer 1002 was then polished using chemical-mechanical polishing (CMP) to remove the surface roughness 1006 caused by the ion-cut separation of the silicon layer 1002 and in this example also to substantially reduce its thickness. The CMP process was controlled so that the final Si layer 1102 had a thickness of only about 1100 Å. However, the CMP process can in general be configured to provide essential any practical desired thickness of the Si layer 1102

For example, a 0.25 µm fully-depleted (FD) CMOS process requires a silicon layer thickness of about 750 Å. By contrast, a 0.5 µm FD process requires a thickness of about 1100 Å, as is the case in this example.

Figure 11:
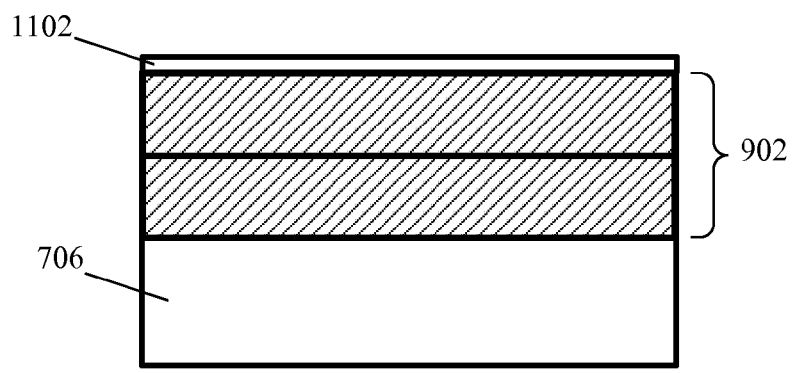

The result of these steps is the SOI wafer product shown in FIG. 11, consisting of an 1100 Å layer 1102 of device quality (100) Si disposed on a 400 nm layer 902 of electrically insulating but thermally conductive AlN, disposed on a thick Si substrate 706.

Many modifications will be apparent to those skilled in the art without departing from the scope of the present invention.

The invention claimed is:

1. A method of producing a silicon-on-insulator article, the method including:
    forming a first aluminium nitride layer thermally coupled to a first silicon substrate;
    forming a second aluminium nitride layer thermally coupled to a second substrate, the second substrate including at least a surface layer of silicon;
    bonding the first and second aluminium nitride layers of the first and second substrates together so that the first and second aluminium nitride layers are disposed between the first and second substrates; and
    removing a portion the second substrate to leave a layer of silicon that is electrically insulated from but thermally coupled to the first silicon substrate by the first and second aluminium nitride layers;

wherein a combined thickness of the bonded aluminium nitride layers is selected to be at least 200 nm to provide electrical isolation between the first silicon substrate and CMOS devices formed in the layer of silicon, while the thermal conductivities of the first and second aluminium nitride layers nevertheless enable conduction of heat through the bonded aluminium nitride layers to mitigate self-heating of the CMOS devices formed in the layer of silicon, wherein the combined thickness of the bonded aluminium nitride layers is about 2 μm.

2. A method of producing a silicon-on-insulator article, the method including:
 forming a first aluminium nitride layer thermally coupled to a first silicon substrate;
 forming a second aluminium nitride layer thermally coupled to a second substrate, the second substrate including at least a surface layer of silicon;
 bonding the first and second aluminium nitride layers of the first and second substrates together so that the first and second aluminium nitride layers are disposed between the first and second substrates; and
 removing a portion the second substrate to leave a layer of silicon that is electrically insulated from but thermally coupled to the first silicon substrate by the first and second aluminium nitride layers;
 wherein a combined thickness of the bonded aluminium nitride layers is selected to be at least 200 nm to provide electrical isolation between the first silicon substrate and CMOS devices formed in the layer of silicon, while the thermal conductivities of the first and second aluminium nitride layers nevertheless enable conduction of heat through the bonded aluminium nitride layers to mitigate self-heating of the CMOS devices formed in the layer of silicon, wherein the combined thickness of the bonded aluminium nitride layers is at least 2 μm.

3. The method of claim 2, wherein the first silicon substrate has an electrical resistivity of at least 100 Ohm-cm.

4. The method of claim 2, wherein the first silicon substrate has a (111) crystal orientation.

5. The method of claim 2, wherein the first silicon substrate has a (100) crystal orientation.

6. The method of claim 2, wherein the first aluminium nitride layer is epitaxially grown on the first silicon substrate.

7. The method of claim 2, wherein the second aluminium nitride layer is epitaxially grown on the second substrate.

8. The method of claim 2, wherein the first and second aluminium nitride layers are simultaneously epitaxially grown on the first and second substrates.

9. The method of claim 6, wherein at least the first of the aluminium nitride layers has an (002) crystal orientation.

10. The method of claim 2, wherein the layer of silicon has a (100) crystal orientation.

11. The method of claim 2, wherein the layer of silicon has an electrical resistivity of at least 100 Ohm-cm.

12. The method of claim 2, wherein the second substrate is a bulk silicon substrate.

13. The method of claim 12, wherein said removing includes splitting the bulk silicon substrate using an ion cut process.

14. The method of claim 2, wherein the second substrate is a silicon-on-insulator substrate.

15. A method of producing a silicon-on-insulator article, the method including:
 forming a first aluminium nitride layer thermally coupled to a first silicon substrate;
 forming a second aluminium nitride layer thermally coupled to a second substrate, the second substrate including at least a surface layer of silicon;
 bonding the first and second aluminium nitride layers of the first and second substrates together so that the first and second aluminium nitride layers are disposed between the first and second substrates;
 removing a portion the second substrate to leave a layer of silicon that is electrically insulated from but thermally coupled to the first silicon substrate by the first and second aluminium nitride layers;
 wherein a combined thickness of the bonded aluminium nitride layers is selected to be at least 200 nm to provide electrical isolation between the first silicon substrate and CMOS devices formed in the layer of silicon, while the thermal conductivities of the first and second aluminium nitride layers nevertheless enable conduction of heat through the bonded aluminium nitride layers to mitigate self-heating of the CMOS devices formed in the layer of silicon; and
 forming respective silicon nitride layers on the first substrate and the second substrate; wherein the first and second aluminium nitride layers are formed on the respective silicon nitride layers.

16. A method of producing a silicon-on-insulator article, the method including:
 forming a first aluminium nitride layer thermally coupled to a first silicon substrate;
 forming a second aluminium nitride layer thermally coupled to a second substrate, the second substrate including at least a surface layer of silicon;
 bonding the first and second aluminium nitride layers of the first and second substrates together so that the first and second aluminium nitride layers are disposed between the first and second substrates;
 removing a portion the second substrate to leave a layer of silicon that is electrically insulated from but thermally coupled to the first silicon substrate by the first and second aluminium nitride layers;
 wherein a combined thickness of the bonded aluminium nitride layers is selected to be at least 200 nm to provide electrical isolation between the first silicon substrate and CMOS devices formed in the layer of silicon, while the thermal conductivities of the first and second aluminium nitride layers nevertheless enable conduction of heat through the bonded aluminium nitride layers to mitigate self-heating of the CMOS devices formed in the layer of silicon; and
 forming respective first and second bonding layers on the first and second aluminium nitride layers; wherein said bonding includes bonding the first and second bonding layers of the first and second substrates together so that the first and second bonding layers are disposed between the first and second aluminium nitride layers; wherein the first and second bonding layers are silicon layers.

17. The method of claim 16, wherein the first aluminium nitride layer is epitaxially grown on the first silicon substrate.

18. The method of claim 16, wherein the second aluminium nitride layer is epitaxially grown on the second substrate.

19. The method of claim 16, wherein the first and second aluminium nitride layers are simultaneously epitaxially grown on the first and second substrates.

20. The method of claim 16, wherein at least the first of the aluminium nitride layers has an (002) crystal orientation.

21. A method of producing a silicon-on-insulator article, the method including:

epitaxially growing an aluminium nitride layer on a single-crystal silicon substrate; and epitaxially growing a silicon layer on the aluminium nitride layer;

wherein the silicon layer is electrically insulated from but thermally coupled to the silicon substrate by the aluminium nitride layer, a thickness of the epitaxial aluminium nitride layer being selected to be at least 200 nm to provide electrical isolation between the single-crystal silicon substrate and CMOS devices formed in the silicon layer, while the thermal conductivity of the epitaxial aluminium nitride layer nevertheless enables conduction of heat through the epitaxial aluminium nitride layer to the single-crystal silicon substrate to mitigate self-heating of the CMOS devices formed in the silicon layer.

22. A silicon-on-insulator article produced by the method of claim 2.

23. A silicon-on-insulator article, including:
a first silicon layer;
a silicon substrate; and
aluminium nitride layers disposed between the first silicon layer and the silicon substrate; and
at least one bonding layer disposed between the aluminium nitride layers;
wherein the first silicon layer is electrically insulated from but thermally coupled to the silicon substrate by the aluminium nitride layers, a thickness of the aluminium nitride layers being at least 200 nm to provide substantial electrical isolation between the first silicon substrate and CMOS devices formed in the silicon layer, while the thermal conductivities of the aluminium nitride layers nevertheless enable conduction of heat through the aluminium nitride layers to the silicon substrate to mitigate self-heating of the CMOS devices formed in the first silicon layer, wherein the at least one bonding layer includes at least one second silicon layer.

24. The article of claim 23, wherein the silicon substrate has a (111) orientation.

25. The article of claim 23, wherein the silicon substrate, the first silicon layer and the aluminium nitride layer are mutually epitaxial.

26. The article of claim 23, wherein the first silicon layer has a (100) orientation.

27. The article of claim 26, wherein each of the aluminium nitride layers has a (002) orientation.

* * * * *